(12) United States Patent
Sato et al.

(10) Patent No.: US 7,838,996 B2
(45) Date of Patent: Nov. 23, 2010

(54) SEMICONDUCTOR DEVICE

(75) Inventors: Mitsuru Sato, Yokohama (JP); Masaru Kito, Yokohama (JP); Yuzo Nagata, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 48 days.

(21) Appl. No.: 11/826,709

(22) Filed: Jul. 18, 2007

(65) Prior Publication Data
US 2008/0017996 A1 Jan. 24, 2008

(30) Foreign Application Priority Data
Jul. 18, 2006 (JP) ............... 2006-196130

(51) Int. Cl.
*H01L 23/48* (2006.01)
*H01L 23/52* (2006.01)
*H01L 29/40* (2006.01)
(52) U.S. Cl. ............... 257/775; 257/E23.145
(58) Field of Classification Search ............. 257/758, 257/775, 773, 784, E23.145
See application file for complete search history.

(56) References Cited
U.S. PATENT DOCUMENTS
7,112,858 B2 9/2006 Inaba et al.

2006/0118963 A1* 6/2006 Yamada .............. 257/760
2006/0194429 A1 8/2006 Hashimoto et al.
2006/0234165 A1 10/2006 Kamigaki et al.

FOREIGN PATENT DOCUMENTS
JP 07-263677 10/1995
JP 2006-156657 6/2006

OTHER PUBLICATIONS
U.S. Appl. No. 11/826,224, filed Jul. 13, 2007, to Kito.

\* cited by examiner

*Primary Examiner*—David A Zarneke
*Assistant Examiner*—Jenny L Wagner
(74) *Attorney, Agent, or Firm*—Finnegan, Henderson, Farabow, Garrett & Dunner, L.L.P.

(57) ABSTRACT

A semiconductor device comprises a wiring layer. The wiring layer is provided by forming a sidewall film having a closed-loop along a sidewall of a hard mask, etching off the hard mask to leave the sidewall film, and then etching a target material to be etched with a mask of the sidewall film. The wiring layer includes a folded wiring section formed along an end of the hard mask, and a parallel section composed of two parallel wires continued from the folded wiring section. The wiring layer has a closed-loop cut made in a portion except for the folded wiring section and the parallel section. The folded wiring section and the parallel section are used as a contact region for connection to another wire.

3 Claims, 16 Drawing Sheets

SEMICONDUCTOR DEVICE

CROSS REFERENCE TO RELATED APPLICATIONS

This application is based on and claims the benefit of priority from the prior Japanese Patent Application No. 2006-196130, filed on Jul. 18, 2006, the entire contents of which are incorporated herein by reference.

BACKGROUND OF THE INVENTION

1. Field of the Invention

The present invention relates to a semiconductor device, and particularly to a semiconductor device of the type that is formed by etching a target material to be etched through the so-called sidewall transfer process.

2. Description of the Related Art

In formation of a wiring pattern (line-and-space) in a semiconductor manufacturing process, a photolithography mask is used to develop a resist to transfer the pattern to the resist. Then, the resist is used as a mask for etching a target material to be etched in general.

The request for fine patterning of semiconductor devices requires formation of a wiring pattern below the resolution limit of lithography and as a method for realizing this formation, the so-called resist slimming process is known. This method comprises developing a resist; and then applying an isotropic etching to the resist or to a sacrifice film and the like etched with a mask of the resist, thereby forming a line pattern, below the resolution limit of lithography, for example, having a width smaller than the resolution limit width W (a minimum length determined by a resolution limit).

As another method, the so-called sidewall transfer process is known (see, for example, JP-A 7-263677 (hereinafter referred to as Patent Document 1); and JP-A 2006-156657 (hereinafter referred to as Patent Document 2)). This method comprises forming a hard mask and then a resist on a wiring material; thereafter applying a resist slimming process to the resist, and then etching the hard mask using the resist as a mask. After the resist is stripped, a thin film, which is turned into a sidewall film, is deposited, then an anisotropic etching or the like is used to etch the thin film on the bottom and top to form the sidewall film on the sidewall of the hard mask (the above slimming process may be applied to the hard mask itself after processing the hard mask, instead of slimming the resist). Then, an anisotropic etching or an isotropic etching is applied to selectively remove only the hard mask and leave the sidewall film. The sidewall film is used as a mask to process the wiring material. This method makes it possible to form a line-and-space having a smaller width than the dimension of the hard mask that is restricted by the resolution limit width W.

In the sidewall transfer process, the sidewall film is formed in a closed-loop shape surrounding the hard mask and a wiring layer is formed along the film. Therefore, the wiring layer should be used after being cut by etching or the like in any part of the closed-loop (hereinafter, such the cut is referred to as "closed-loop cut").

The wiring layer formed through the sidewall transfer process is turned into a wiring pattern having a width of around ½ of the resolution limit W, which makes it difficult to form a contact region for connection to other wiring. Patent Document 2 discloses that a folded section of the sidewall film formed in a prolate ellipsoidal closed-loop is cut and the folded section is used as a contact region. In the configuration of Patent Document 2, however, the folded section used as the contact region locates in the proximity of an adjacent wiring layer and reduces the margin of deviation in position of the contact as a problem.

In addition, the wiring layers are formed at a narrow pitch below the resolution limit W, which results in a small tolerance (margin) of alignment deviation in closed-loop cut as a problem.

SUMMARY OF THE INVENTION

In an aspect the present invention provides a semiconductor device, comprising a wiring layer, the wiring layer provided by forming a sidewall film having a closed-loop along a sidewall of a hard mask, etching off the hard mask to leave the sidewall film, and then etching a target material to be etched with a mask of the sidewall film, wherein the wiring layer includes a folded wiring section formed along an end of the hard mask, and a parallel section composed of two parallel wires continued from the folded wiring section, with a closed-loop cut made in a portion except for the folded wiring section and the parallel section, wherein the folded wiring section and the parallel section are used as a contact region for connection to another wire.

In another aspect the present invention provides a semiconductor device, comprising a wiring layer, the wiring layer provided by forming a sidewall film having a closed-loop along a sidewall of a hard mask, etching off the hard mask to leave the sidewall film, and then etching a target material to be etched with a mask of the sidewall film, wherein the wiring layer includes a folded wiring section formed along an end of the hard mask and wider than other portions, with a closed-loop cut made in a portion except for the folded wiring section, wherein the folded wiring section is used as a contact region for connection to another wire.

In yet another aspect the present invention provides a semiconductor device, comprising a wiring layer, the wiring layer provided by forming a sidewall film having a closed-loop along a sidewall of a hard mask, the hard mask having a long side and a plurality of short sides extending along a direction perpendicular to the long side, etching off the hard mask to leave the sidewall film, and then etching a target material to be etched with a mask of the sidewall film, wherein the wiring layer is cut at a position in the short side or at a position in the long side located between the short sides, and is cut in an end of the long side.

DETAILED DESCRIPTION OF THE EMBODIMENTS

The embodiments of the present invention will now be described in detail with reference to the drawings.

First Embodiment

The following description is given to a semiconductor device according to a first embodiment of the present invention.

FIGS. 1A-D are cross-sectional views illustrative of process steps of manufacturing the semiconductor device according to the first embodiment. On a semiconductor substrate 100, a wiring material 200 is deposited for formation of a wiring layer, and a hard mask 11 is formed thereon.

Figure 1A:
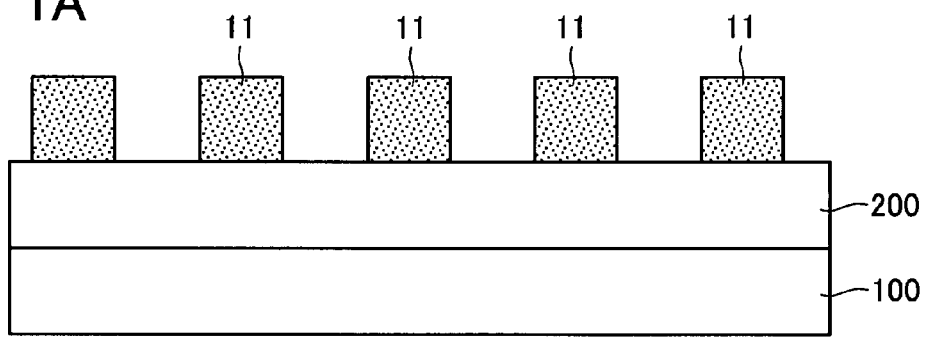
FIGS. 1A-1D are cross-sectional views illustrative of a configuration of a semiconductor device and the process steps of manufacturing the same according to a first embodiment of the present invention.
Figure 1B:
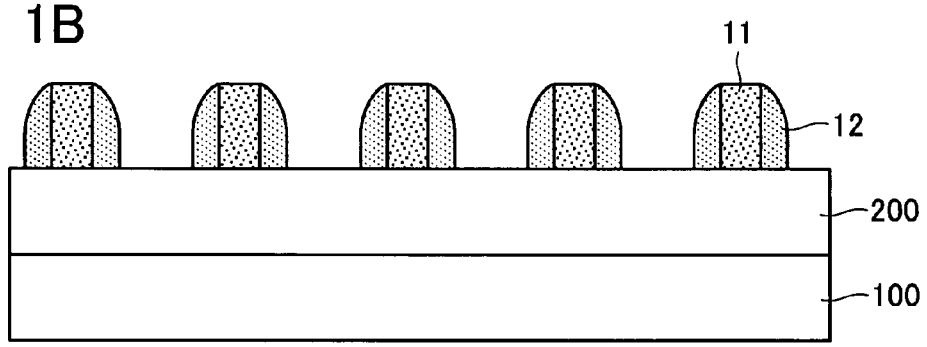

As shown in FIG. 1A, a process of photolithography and etching using a resist, not shown, is applied to pattern the hard mask 11 in a desired wiring pattern. Thereafter, as shown in FIG. 1B, an isotropic etching is used for the so-called slimming process to slim the width of the hard mask 11. Then, a thin film, which is turned into a sidewall film for the sidewall transfer process, is deposited over the entire surface including sidewalls of the hard mask 11. An anisotropic etching or the like is used to etch off the thin film deposited on the top and bottom of the hard mask 11 to form a sidewall film 12 for the sidewall transfer process on the sidewalls of the hard mask 11.

The hard mask 11 may be composed of a BSG film. The sidewall film 12 can be formed of a material having a higher selective ratio for the hard mask 11, such as a silicon nitride film if the hard mask 11 is composed of the BSG film.

Figure 1C:
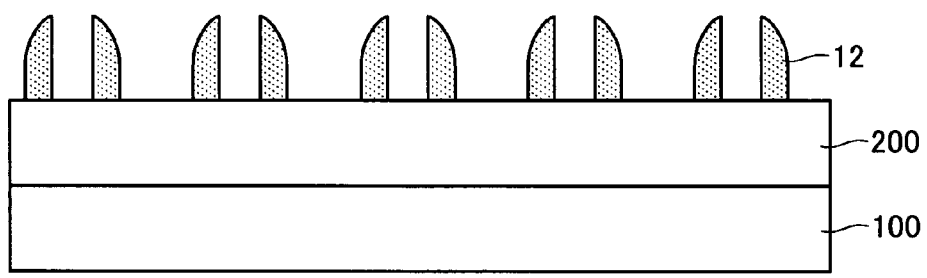
Figure 1D:
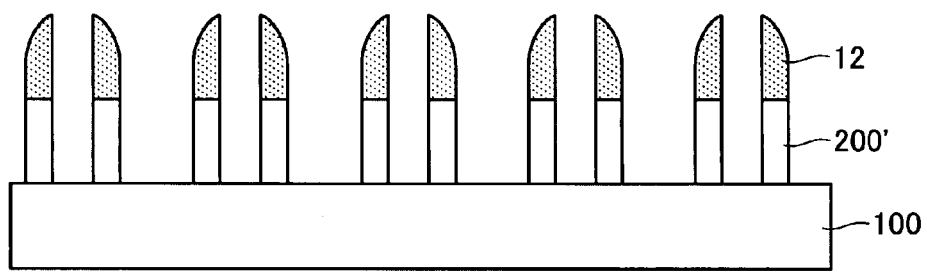

Next, as shown in FIG. 1C, a wet etching with a fluorinated acid solution is applied to etch off the hard mask 11 to leave only the sidewall film 12 having a higher selective ratio for the hardmask 11. Thereafter, as shown in FIG. 1D, an anisotropic etching with a mask of the sidewall film 12 is applied to etch a wiring material 200 to form a wiring layer 200'. As the sidewall film 12 is formed in a closed-loop shape that covers the outer circumference of the patterned hard mask 11, the wiring layer 200' is also formed in a closed-loop shape along the sidewall film 12.

A wiring layer 200A formed in the closed-loop shape is provided with closed-loop cuts in the closed-loop at two or more locations as described later to form two or more wires.

Figure 2A:
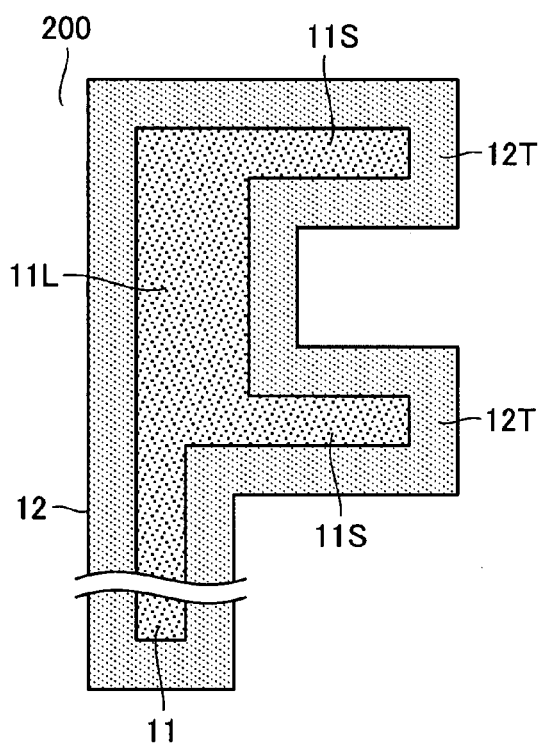
FIGS. 2A-2F are plan views illustrative of the configuration of the semiconductor device and the process steps of manufacturing the same according to the first embodiment of the present invention.

FIG. 2A shows an example of a plane shape of the hard mask 11 described in FIG. 1 and the sidewall film 12 formed on the sidewalls thereof (that is, the wiring layer 200' formed there beneath). As shown in FIG. 2A, the hard mask 11 of this embodiment is formed in an "F"-shape. This shape has a long side 11L extending along the longitudinal direction of the wiring layer 200' to be formed later, and a plurality (two in this example) of short sides 11S extending in a direction perpendicular to the long side. The sidewall film 12 is formed along the outer circumferences of not only the long side 11L but also the short sides 11S such that it has end portions 12T each folded around the short side 11S. It is formed in a closed-loop shape that covers the outer circumference of the hard mask 11.

Figure 2B:
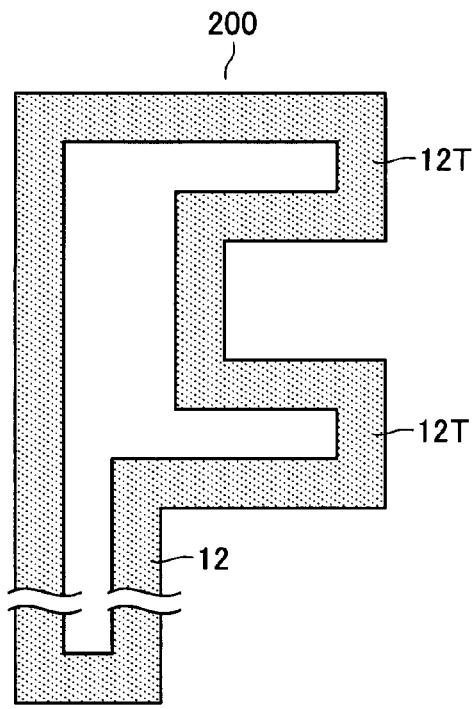
Figure 2C:
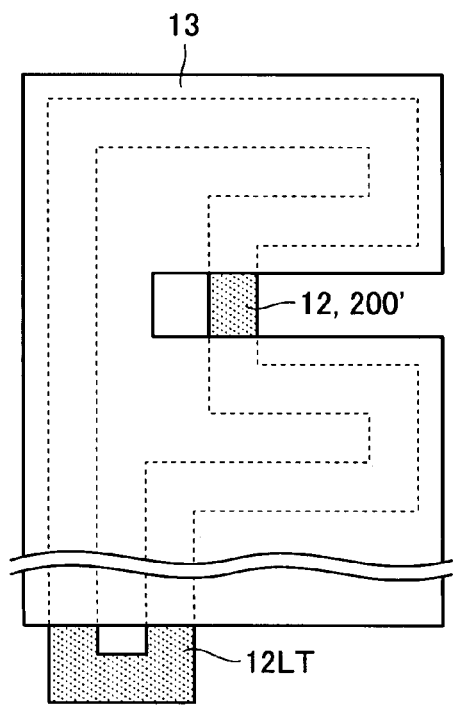

When the hard mask 11 is etched off in the step of FIG. 1B after formation of the sidewall film 12, only the sidewall film 12 in the closed-loop shape extending along the outer circumference of the F-shaped pattern remains on the wiring material 200 as shown in FIG. 2B. Then, after the wiring material 200 is turned into the etched wiring layer 200' as shown in FIG. 1C, a resist 13 is formed. In this case, only the sidewall film 12, at the right side of the long side 11L sandwiched between two short sides 11S of the "F"-shaped hard mask 11 as shown in FIG. 2C, and an end portion 12LT of the long side are exposed, and other portions are covered with the resist 13.

Figure 2D:
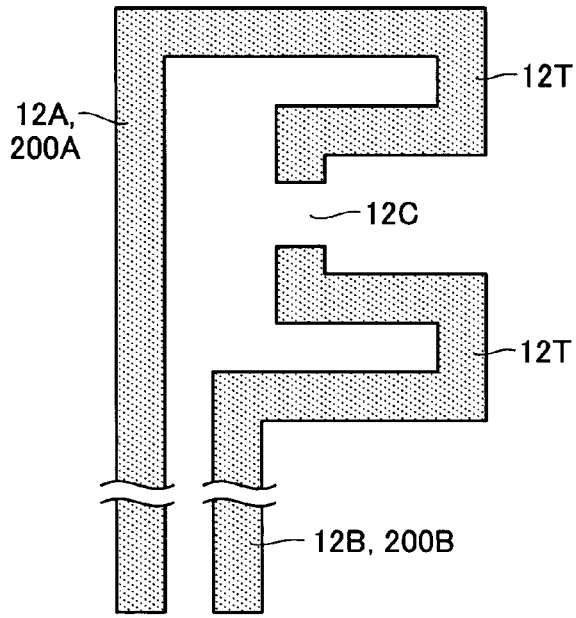
Figure 2E:
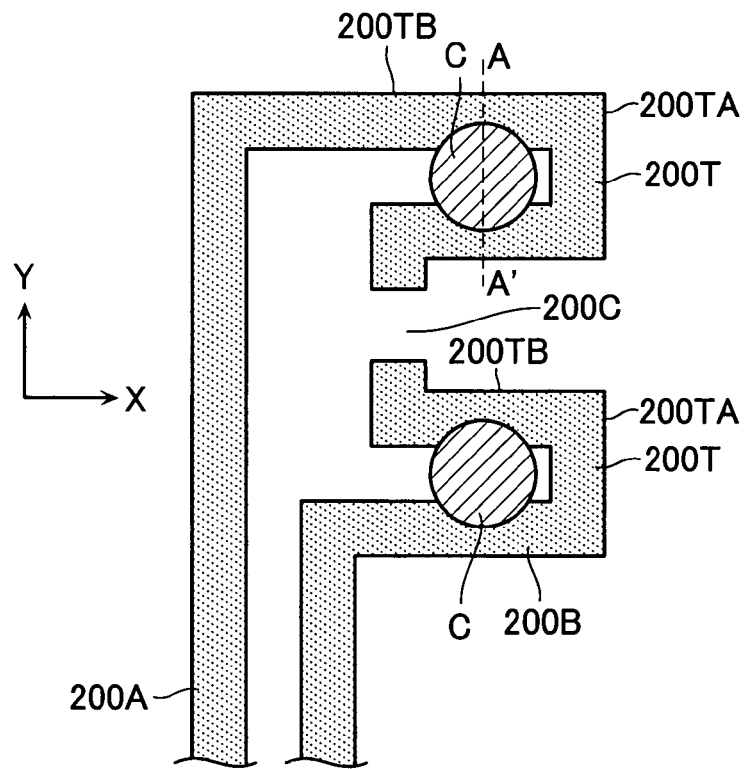

Thereafter, an etching is executed with a mask of the resist 13 to etch or cut the sidewall film 12 and the underlying wiring layer 200' at an exposed section 12C and at an end portion 12LT of the long side 11L as shown in FIG. 2D. As a result, the sidewall film 12 in the closed-loop shape is cut at the exposed section 12C and at the end portion 12LT of the long side 11L to form two sidewall films 12A, 12B. The wiring layer 200' is also divided in two under the two sidewall films 12A, 12B and turned into two wiring layers 200A, 200B as shown in FIG. 2E. Cutting the wiring layer 200' may be achieved by cutting a desired portion (a portion opened in FIG. 2C) of the sidewall film 12, prior to forming the sidewall film 12 and etching the wiring material 200. Namely, prior to etching the wiring material 200 in a desired shape, the sidewall film 12 itself is etched in a desired final shape. Then, it is used as a mask to etch the wiring material 200, thereby forming the wiring layers 200A and 200B that are automatically cut in desired shapes at desired positions.

On the other hand, an end portion 200T, which is formed as folded around the short side 11S, includes a folded wiring section 200TA or the folded portion, and a parallel section 200TB composed of two substantially parallel wires continued therefrom, as shown in FIG. 2E.

Figure 2F:
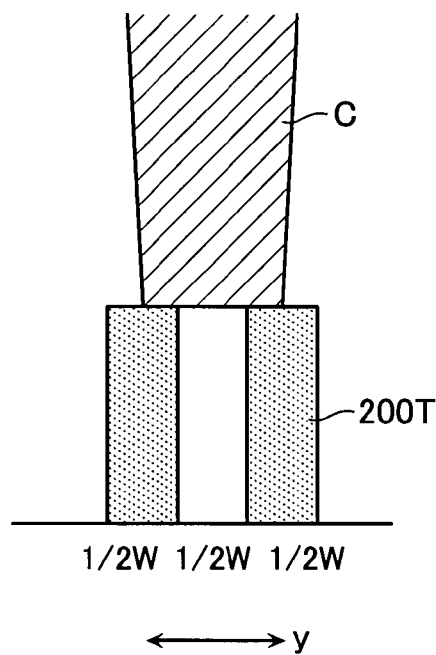

At portions except for the end portion 200T (for example, the above-described portions 12LT and 12C), the wiring layer 200' is subjected to the closed-loop cut to form two wiring layers 200A and 200B as described above. In such the case, two such end portions 200T (the folded wiring section 200TA and the parallel section 200TB) may be available as respective contact regions for these two wiring layers 200A and 200B. The short side 11S of the hard mask 11 may be formed to have a width near the resolution limit W. Then, the width may be slimmed to ½ W, around ½ of the resolution limit width W, through the so-called slimming process (a process to slim the width of a resist by isotropic etching). In this case, the sidewall film 12 also has a width of around ½ W. Accordingly, the wiring width along the A-A' direction (FIG. 2E) of the end portion 200T used as the contact region is around 3⁄2 W (=3=½ W), equal to a total of a line, a space, and a line. Therefore, as shown in FIG. 2F, which is a cross-sectional view along the segment A-A' of FIG. 2E, it is possible to set a large margin of alignment deviation in lithography when a contact C falls on the end portion 200T. Namely, with regard to the X-direction (the longitudinal direction of the short side 11S) shown in FIG. 2E, the alignment of the contact C makes it possible to set a margin of alignment deviation in accordance with the length of the short side 11S, that is, the end portion 200T (the folded wiring section 200TA+the parallel section 200TB).

On the other hand, also in the Y-direction (the lateral direction of the short side 11S) shown in FIGS. 2E and 2F, there is a width of ½ W. Accordingly, a contact having a width of the resolution limit width W can be usually brought into contact with both sides of the folded wiring of the end portion 200T as shown in FIG. 2F. If the contact C greatly deviates and only contacts one side of the folded wiring of the end portion 200T, no problem arises on the electrical connection. Therefore, it is also possible in the Y-direction to set a large margin of alignment deviation.

In the present embodiment, the hard mask 11 is formed in the F-shape and the end portions 200T formed along the short side 11S are used as the contact regions for the wiring layers 200A, 200B though the present invention is not limited to this example. Namely, the hard mask 11 may be shaped arbitrarily if the end portion 200T can be formed same as above.

Second Embodiment

Figure 3A:
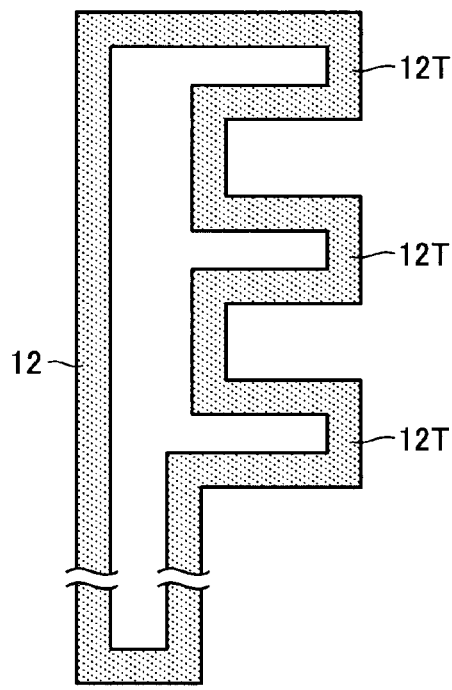
FIGS. 3A-3D are plan views illustrative of a configuration of a semiconductor device and the process steps of manufacturing the same according to a second embodiment of the present invention.

A semiconductor device according to a second embodiment of the present invention is described with reference to FIGS. 3A-D, in which the same components as those in the first embodiment are denoted with the same reference numerals in the figure and omitted from the following detailed description. This embodiment is different from the first embodiment in that the short sides 11S of the hard mask 11 are provided three and accordingly the end portions 12T of the sidewall film 12 formed along the short sides are also provided three as shown in FIG. 3A. (The step of forming the state of FIG. 3A is almost same as that described in FIG. 2A and omitted from the following detailed description).

Figure 3B:
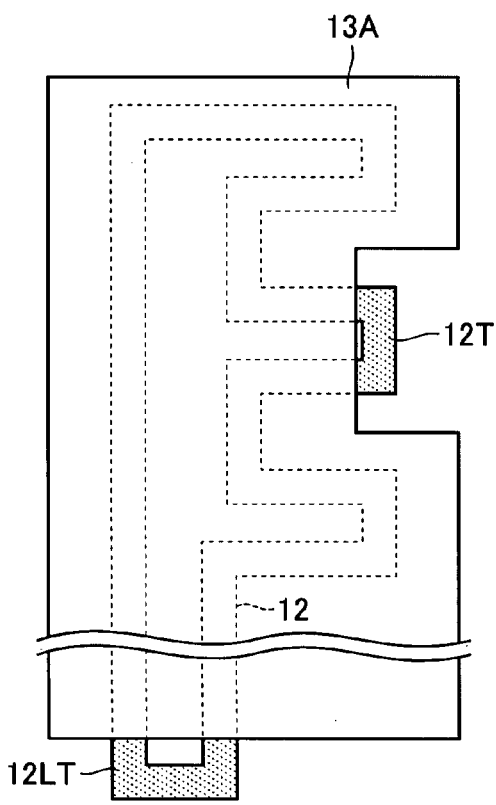
Figure 3D:
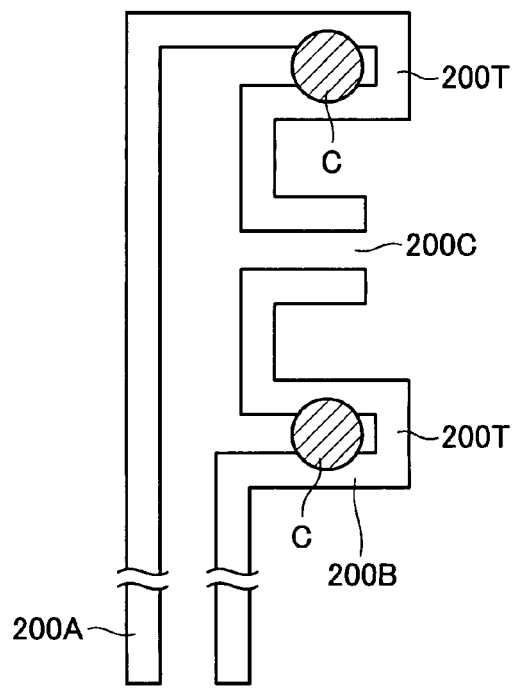
Figure 3C:
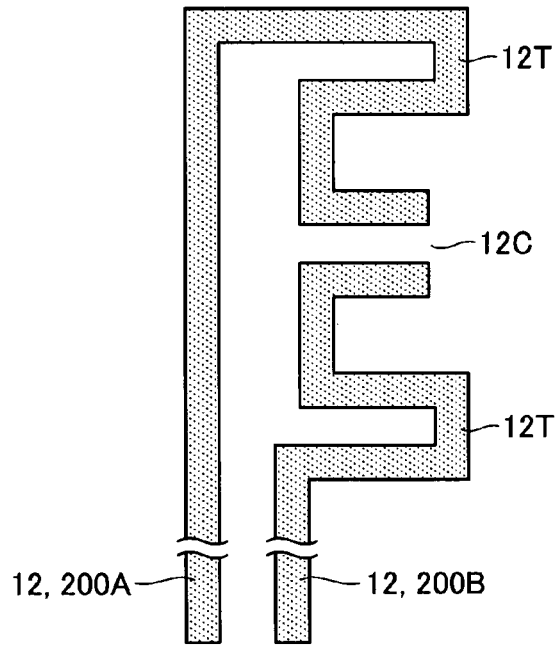

Then, as shown in FIG. 3B, only a portion (for example, the tip) of the central one of three end portions 12T and an end portion 12LT of the long side 11L of the hard mask 11 are exposed, and others are covered with a resist 13A. Then, as shown in FIG. 3C, only the portion (the tip in FIG. 3C) of the central one of three end portions 12T and the proximity of an end portion 11LT of the long side 11L are cut to divide the wiring layer 200' in a closed-loop shape into two wiring layers 200A, 200B (FIG. 3D).

As obvious from the comparison between FIG. 2B and FIG. 3B, in the second embodiment, a closed-loop cut may be made not in a portion along the long side at the base of the end portion 12T but in a portion of the end portion 12T, for example, the tip. Therefore, the margin of alignment deviation in photolithography can be made wider than that in the first embodiment. In this regard, the yield can be improved over the first embodiment.

Figure 4A:
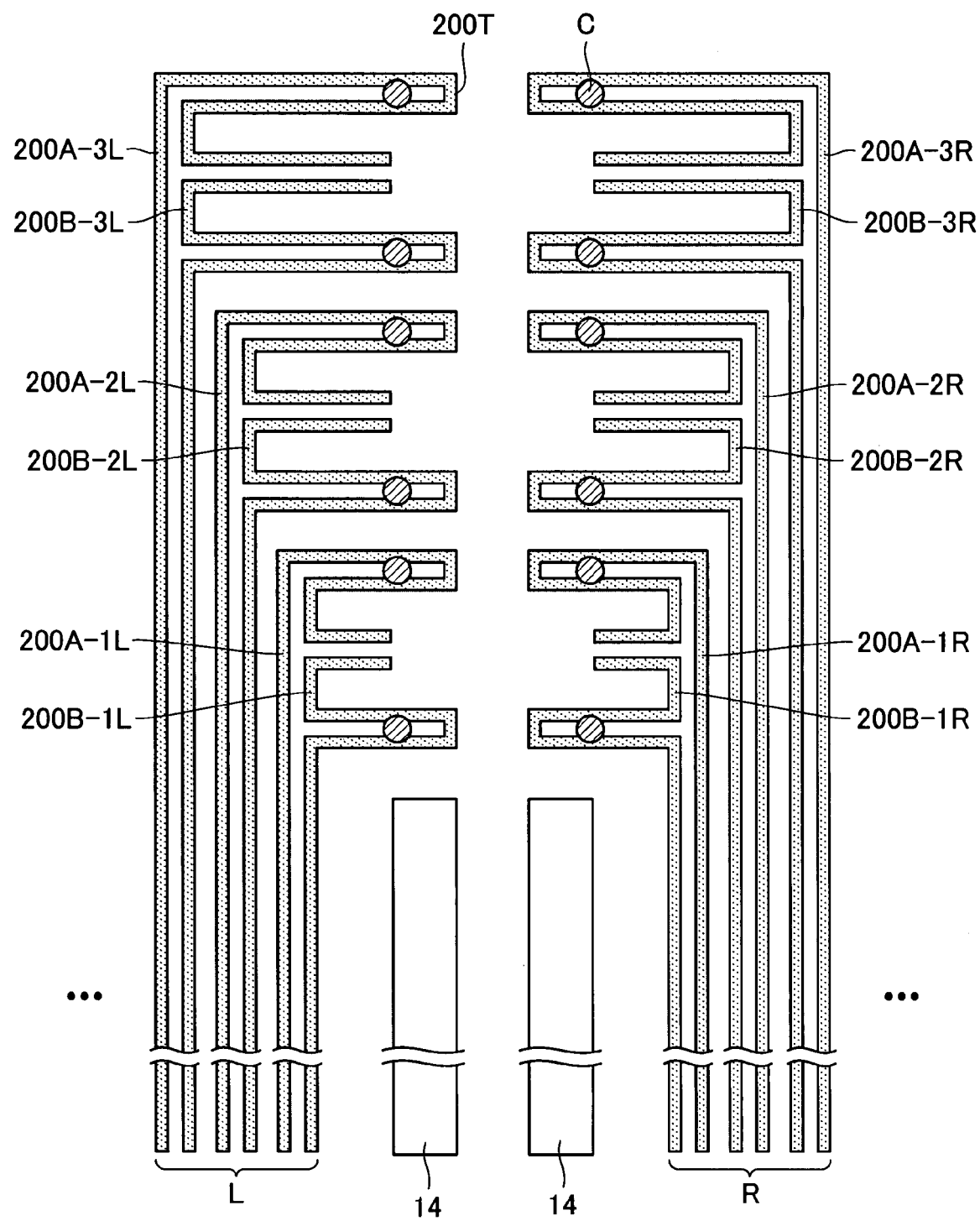
FIGS. 4A and 4B show an example of the layout of a wiring layer in the semiconductor device according to the second embodiment of the present invention.
Figure 4B:
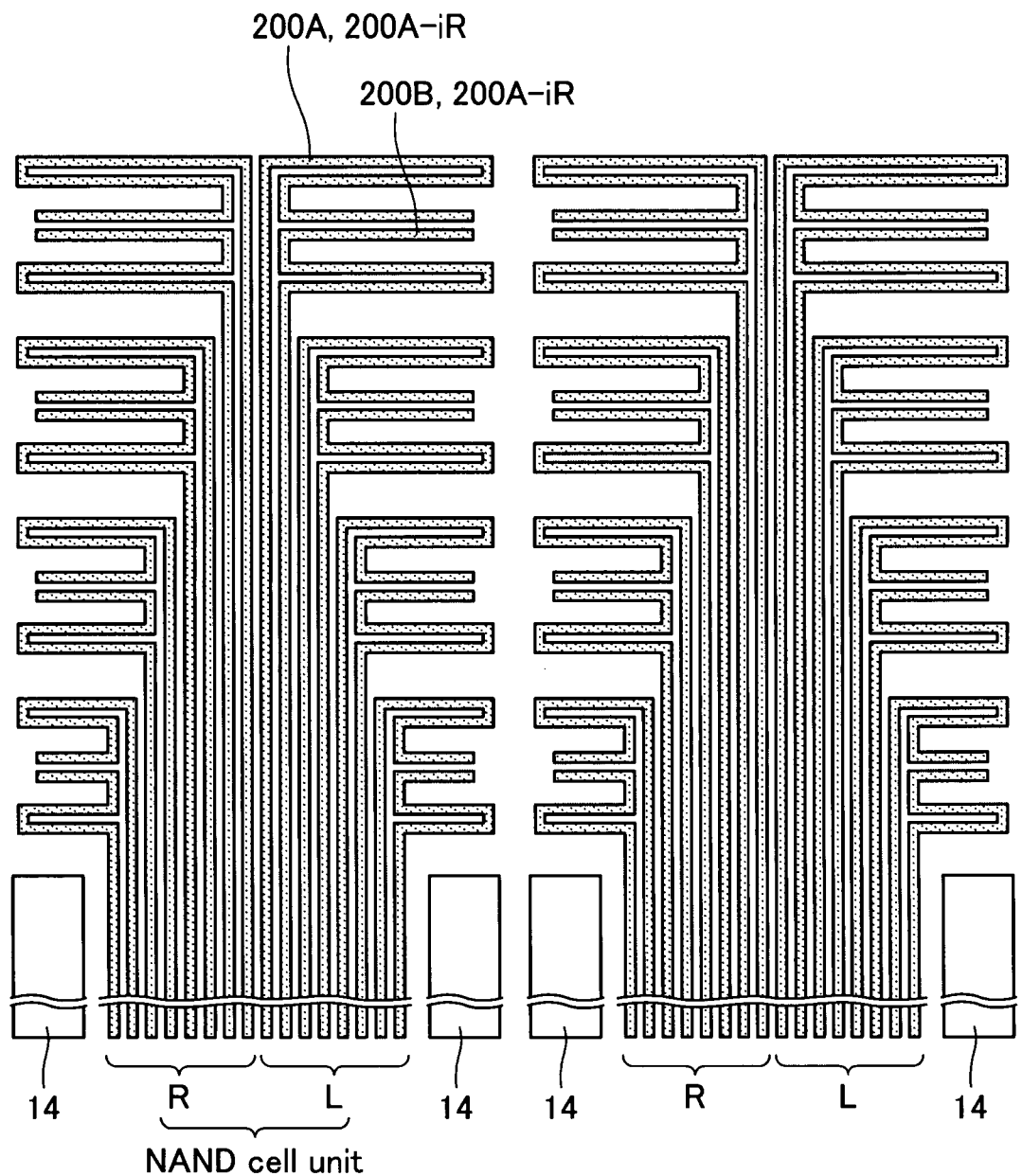

FIGS. 4A and 4B show an exemplary layout of the wiring layer 200' of the second embodiment. FIG. 4B shows a general view of the layout and FIG. 4A shows a partial enlarged view thereof. This layout example is an example to the last and various layouts may be available as long as they can exert the same effect of the present embodiment. It is also possible to use the same layout in the wiring layer 200' shaped as in the first embodiment. It is assumed herein that the present embodiment is applied to word lines in an NAND-type flash memory.

In the example of FIGS. 4A and 4B, the wiring layers 200A, 200B shaped as shown in FIG. 3 are located laterally symmetrical about a selection gate line 14 arranged at the center, and are provided more than one on each of the left and right sides. In this example, as shown in FIG. 4B, on the left side of the selection gate line 14, a set L of eight wiring layers 200A and 200B (the wiring layers 200A, 200B provided four each, and eight in total) is arranged. Similarly, on the right side of a selection gate line 14, a set R of eight wiring layers 200A and 200B (the wiring layers 200A, 200B provided four each, and eight in total) is arranged.

Two selection gate lines 14 and a total of 16 wiring layers 200A, 200B (word lines) contained in the sets L, R sandwiched therebetween form one NAND cell unit. The number of word lines contained in one NAND cell unit is not limited to 16, needless to say.

FIG. 4A denotes the wiring layers 200A, 200B contained in these sets L, R with such reference numerals as 200A-iL, 200B-iL, 200A-iR, 200B-iR. In this case, L indicates wiring layers in the set L, and R indicates wiring layers in the set R, with a subscript i (i=1, 2, 3 . . . ) indicative of one of plural wiring layers contained in each of the sets L, R.

On each of the left and right sides (each of the sets L, R), beneath an end portion 200T of a pair of wiring layers 200A-i+1L(R) and 200B-i+iL(R), another pair of wiring layers 200A-iL(R) and 200B-iL(R) is accommodated entirely. In this case, both are arranged such that the tips of the end portions 200T are almost aligned.

In addition, two opposite pairs of wiring layers (200A-iL, 200B-iL), (200A-iR, 200B-iR) arranged on both the left and right sides have end portions 200T aligned almost on the same straight line.

Figure 4C:
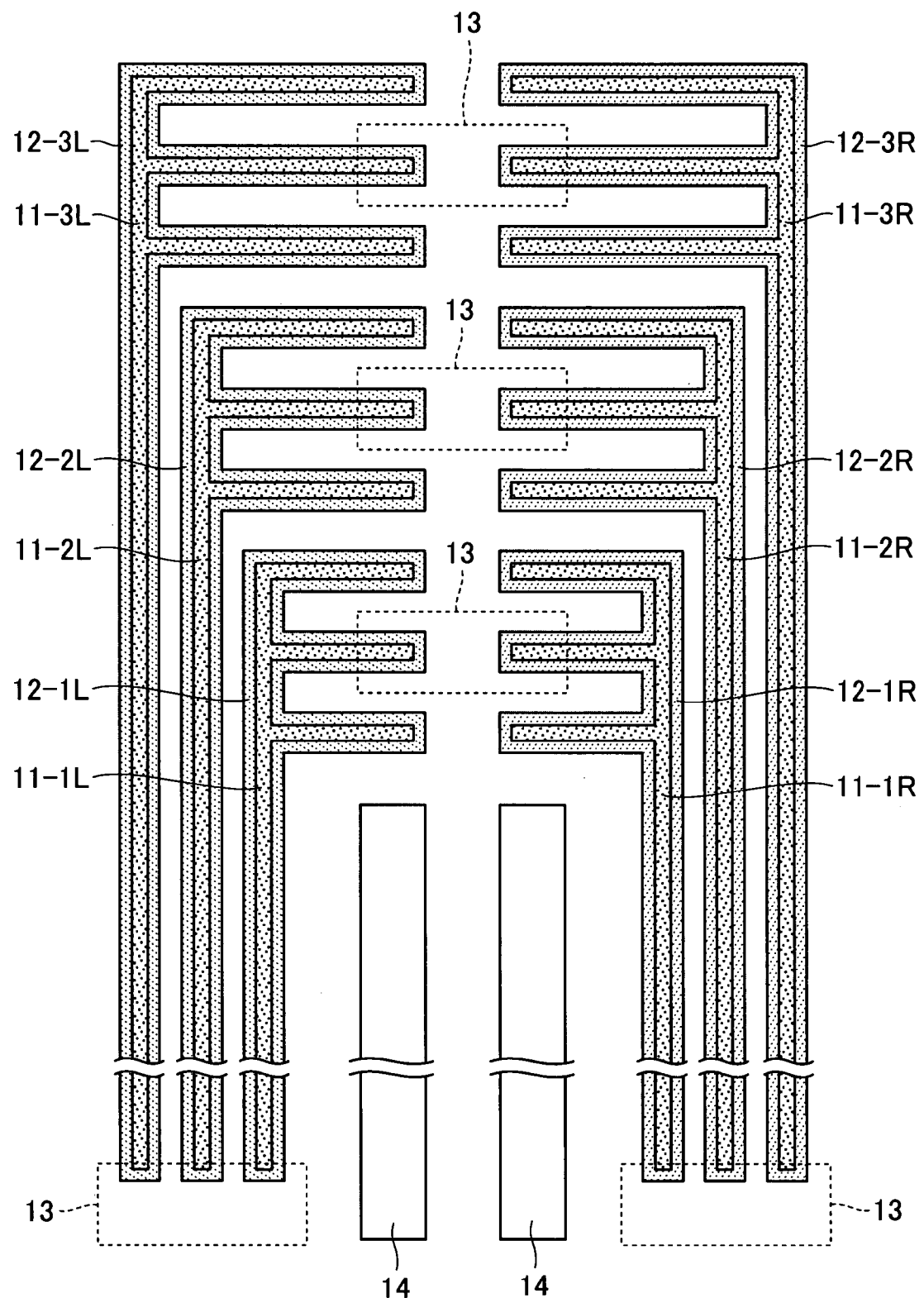
FIG. 4C shows part of process steps in forming the layout example shown in FIG. 4A.

FIG. 4C shows part of process steps in the layout example shown in FIG. 4A. To form the wiring layers 200A-iL, 200B-iL, 200A-iR, 200B-iR, hard masks 11-iL and 11-iR formed thereon, and sidewall films 12-iL and 12-iR formed on the outer circumferences thereof are shown. The process steps are same as those shown in FIGS. 3A-D and the duplicated description thereof is omitted herein. In such the layout, it is possible to make a closed-loop cut in the end portion 12T with a resist 13 having an aperture common to the left and right sides as shown with the dotted line in FIG. 4C.

Figure 5:
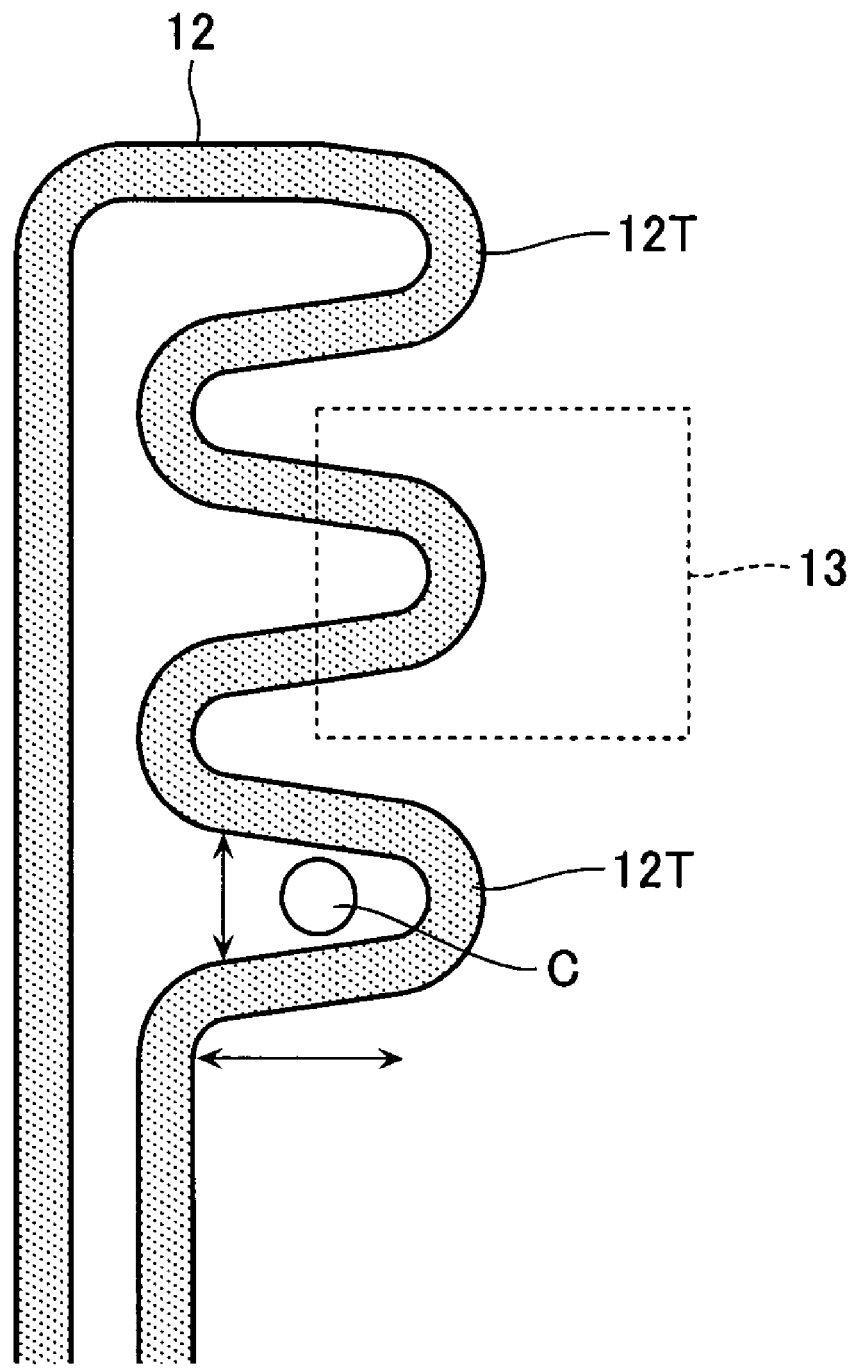
FIG. 5 shows a problem caused in the layout of FIG. 4A.

In the layout as in FIGS. 4A, 4B, the hard masks 11-1L, R located proximate to the selection gate line 14 tend to have shorter short sides 11S as fine patterning proceeds. In addition, an end portion 12T' of the sidewall film 12 to be formed gradually nears a wave shape (with widths made wider as apart from the tip), as shown in FIG. 5, far apart from a rectangular shape. In this case, if the end portion 200T of the underlying wiring layer below the end portion 12T is used as a contact region, a contact C may fall in spacing because of an excessive wide space. Otherwise, the alignment margin in lithography or etching for closed-loop cut (margin of alignment deviation in the position on which the aperture in the resist 13 is formed) is reduced as a problem.

Figure 6A:
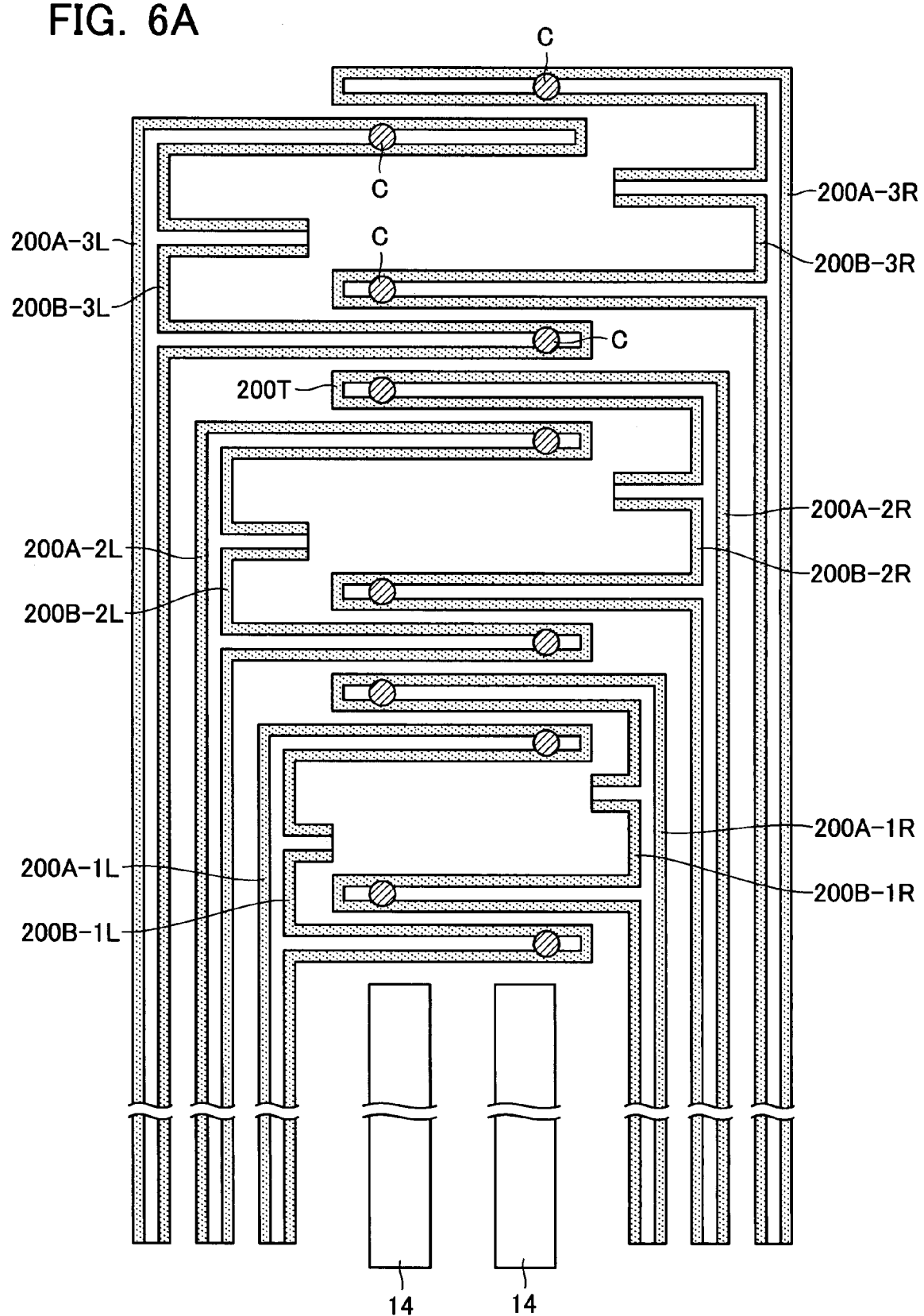
FIG. 6A shows another example of the layout of a wiring layer in the semiconductor device according to the second embodiment of the present invention.

FIG. 6A shows another example of the layout ready for this problem. In this example, the wiring layers 200A-iL, 200B-iL, 200A-iR, 200B-iR on the left and right sides are not laterally symmetrical. Rather, the end portions (200T) of the wiring layers 200A-iL, 200B-iL are so nested that they enter spaces between the end portions 200T of the opposite wiring layers 200A-iR, 200B-iR, different from the layout example of FIGS. 4A, 4B.

Figure 6B:
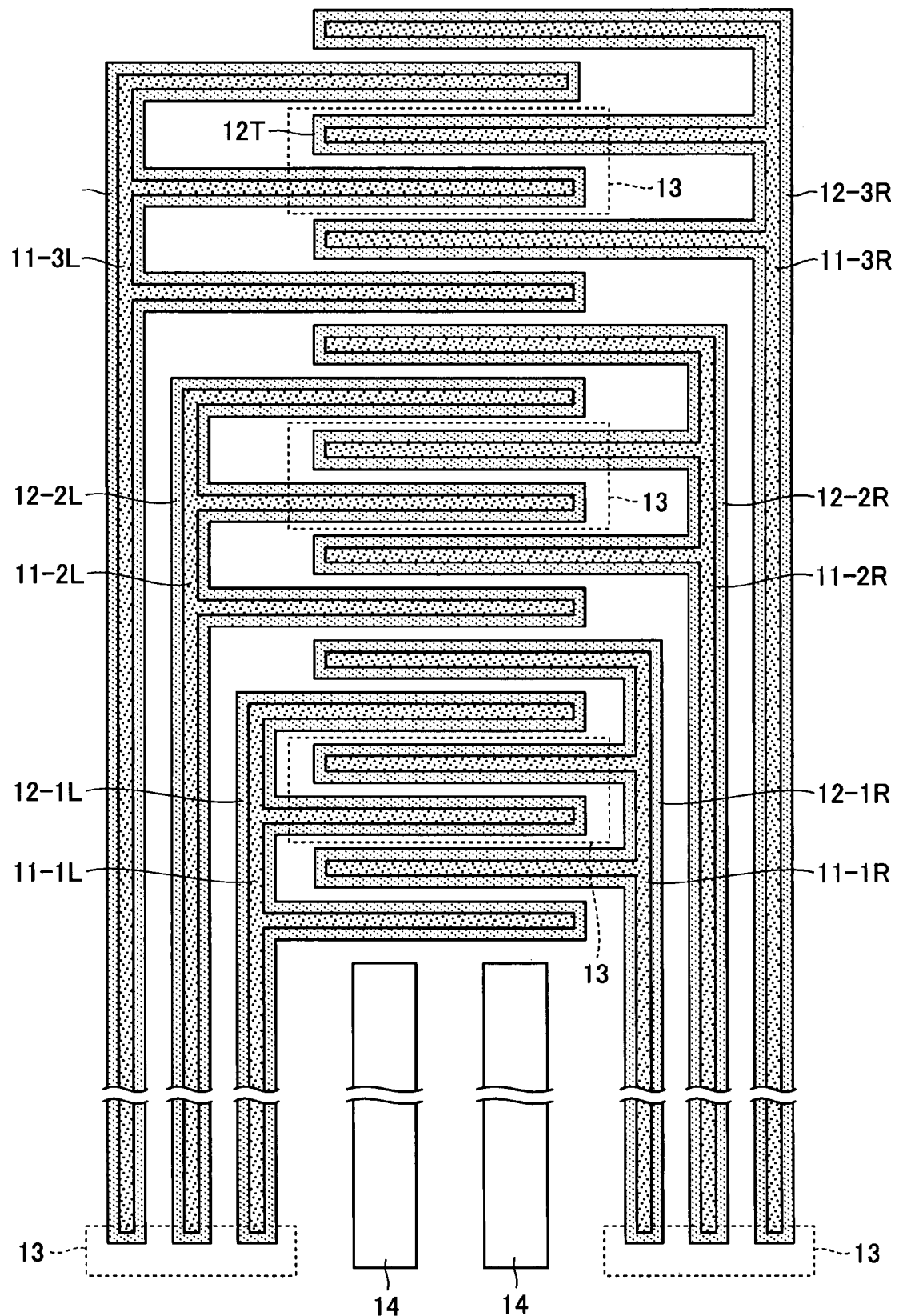
FIG. 6B shows part of process steps in forming the layout example shown in FIG. 6A.

In this layout example, the wiring layers 200A-1L, 200B-1L, 200A-1R, 200B-1R proximate to the selection gate line 14 can retain the length in the longitudinal direction (X-direction) of the end portion 200T even under the situation where fine patterning proceeds. Therefore, it is possible to provide a large alignment margin in contact formation and lithography and etching and accordingly improve the yield. FIG. 6B shows part of process steps in the layout example of FIG. 6A. To form the wiring layers 200A-iL, 200B-iL, 200A-iR, 200B-iR, hard masks 11-iL and 11-iR formed thereon, and sidewall films 12-iL and 12-iR formed on the outer circumferences thereof are shown.

The process steps are same as those shown in FIGS. 3A-3D and the duplicated description thereof is omitted herein. In this case, however, it is possible to make a closed-loop cut in the end portion 12T with a resist 13 having a rectangular aperture that surrounds the end portion 12T interposed in the above-described space.

The example using the hard mask 11 having three short sides 11S is herein shown though this layout is also applicable to a hard mask having two short sides as in the first embodiment or to those having four short sides or more.

Third Embodiment

A semiconductor device according to a third embodiment of the present invention is described with reference to FIGS. 7A-7D, in which the same components as those in the first embodiment are denoted with the same reference numerals in the figure and omitted from the following detailed description. This embodiment describes an example in forming the hard mask 11 having two short sides 11S as in the first embodiment.

Figure 7A:
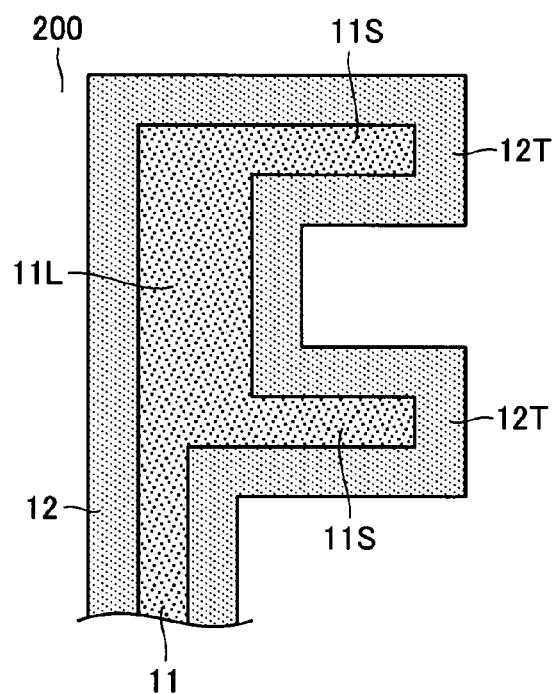
FIGS. 7A-7D are plan views illustrative of a configuration of a semiconductor device and the process steps of manufacturing the same according to a third embodiment of the present invention.
Figure 7B:
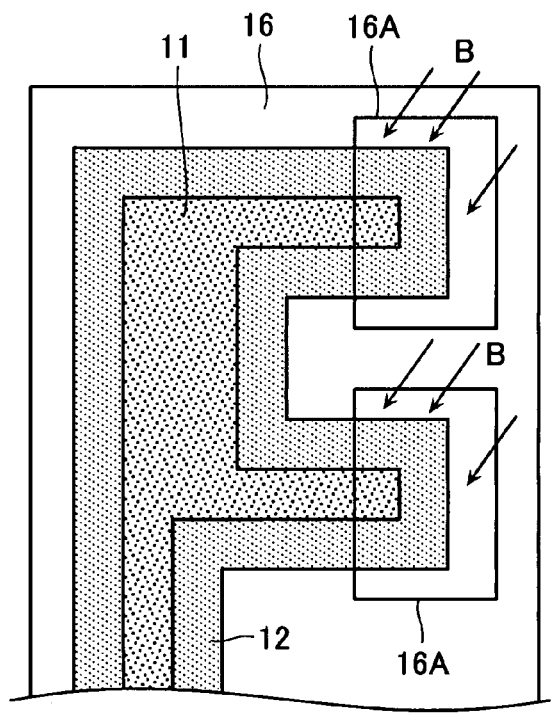
Figure 7C:
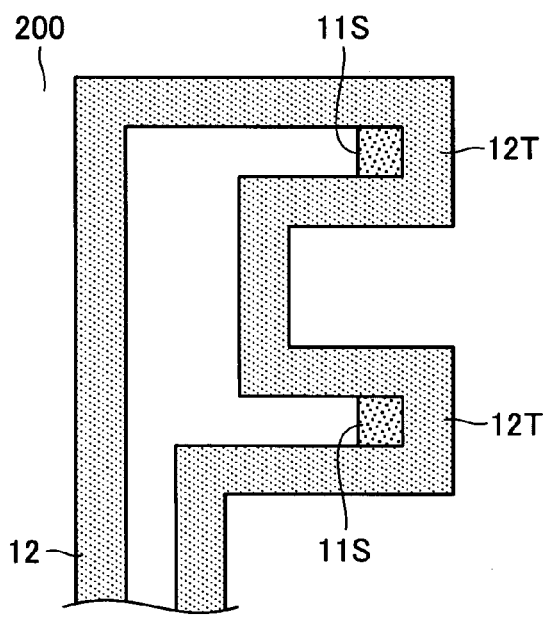
Figure 7D:
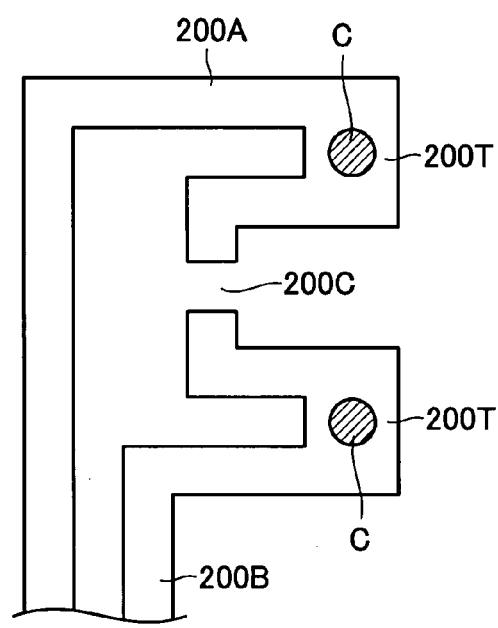
Figure 8A:
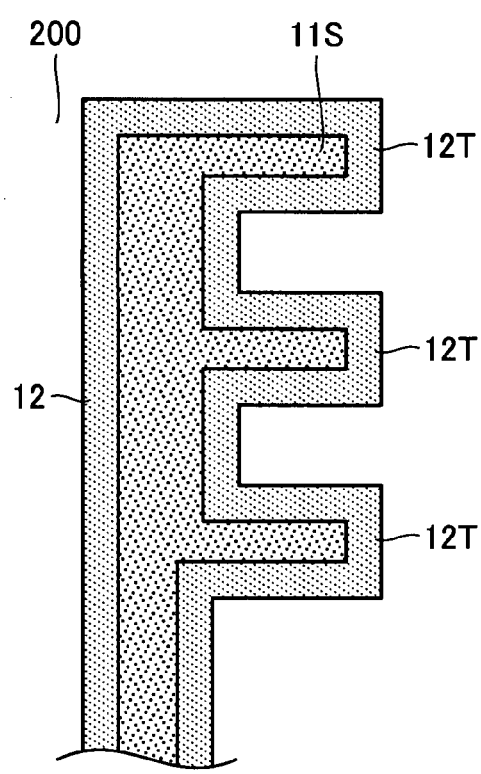
FIGS. 8A-8D are plan views illustrative of the configuration of the semiconductor device and the process steps of manufacturing the same according to the third embodiment of the present invention.
Figure 8B:
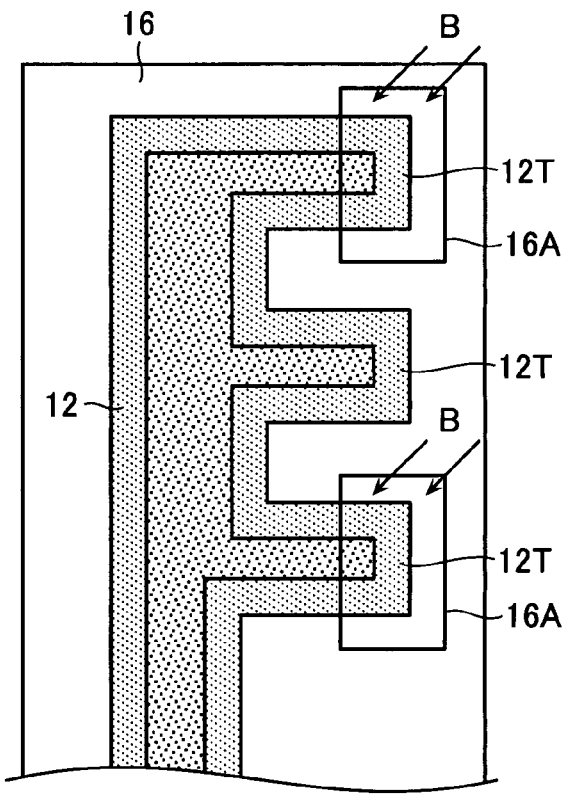
Figure 8C:
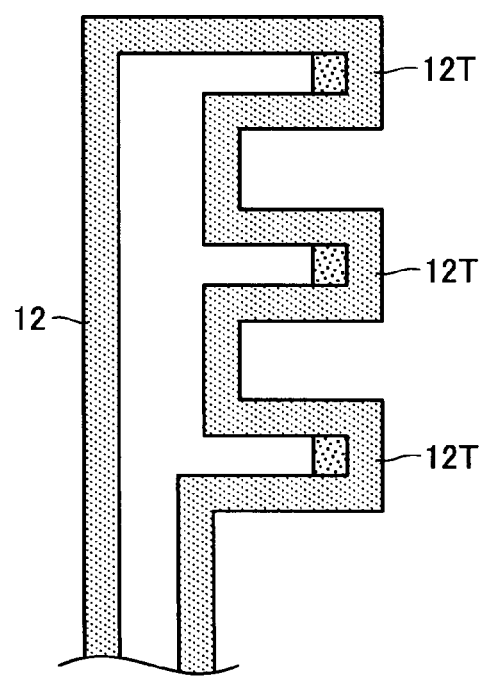
Figure 8D:
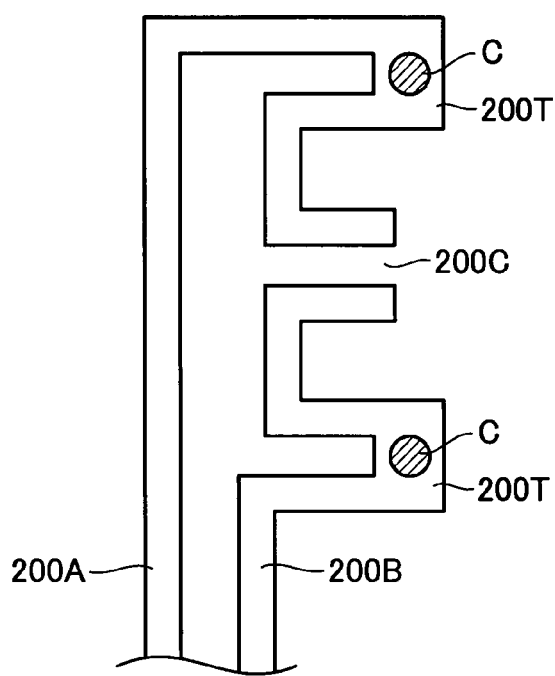

In this example, as shown in FIG. 7A, the hard mask 11 and the sidewall film 12 are formed in the same manner as FIG. 2A (the hard mask 11 is herein composed of amorphous silicon and the sidewall film 12 is a silicon nitride film). Then, a resist 16 is formed having an aperture 16A at a position including the tip of the short side 11S. Thereafter, as shown in FIG. 7B, the resist 16 is used as a mask to implant impurity ions through the aperture 16A. The impurity ions implanted may be of boron (B), boron difluoride ($BF_2$), or the like if the hard mask 11 is composed of amorphous silicon. The portion of the hard mask 11 ion-implanted is higher in selective ratio for wet etching with an alkaline solution, that is, lower in etch rate for wet etching, than a portion of the hard mask 11 not ion-implanted. Therefore, execution of a wet etching with an alkaline solution leaves the tip of the short side 11S of the hardmask 11 and the sidewall film 12 and etches off other portions of the hard mask 11 (FIG. 7C). In this situation, the hard mask 11S and the sidewall film 12 left are used as a mask to etch the wiring material 200. Further, as described in FIG. 2C, closed-loop cuts are made at the positions of the exposed portions 200C and 12LT (not shown in FIGS. 7A-D) to divide the wiring layer into two wiring layers 200A, 200B (FIG. 7D). In the wiring layers 200A, 200B, an end portion 200T (folded wiring section) at the tip of the short side 11S left has a wider line width. This portion may be used as a contact region on which the contact C falls.

In the third embodiment, the hard mask 11 is exemplified as having the F-shape with two short sides 11S though the hard mask 11 may have three short sides 11S (or more) as shown in FIGS. 8A-D.

Alternatives

The embodiments of the invention have been described above though the present invention is not limited to these embodiments but rather can be given various modifications and additions without departing from the scope and spirit of the invention. The hard mask 11 is described as composed of a single material in the above embodiments though the present invention is not limited to this example. For example, the hard mask may be a layered film including a plurality of different materials layered.

Figure 9A:
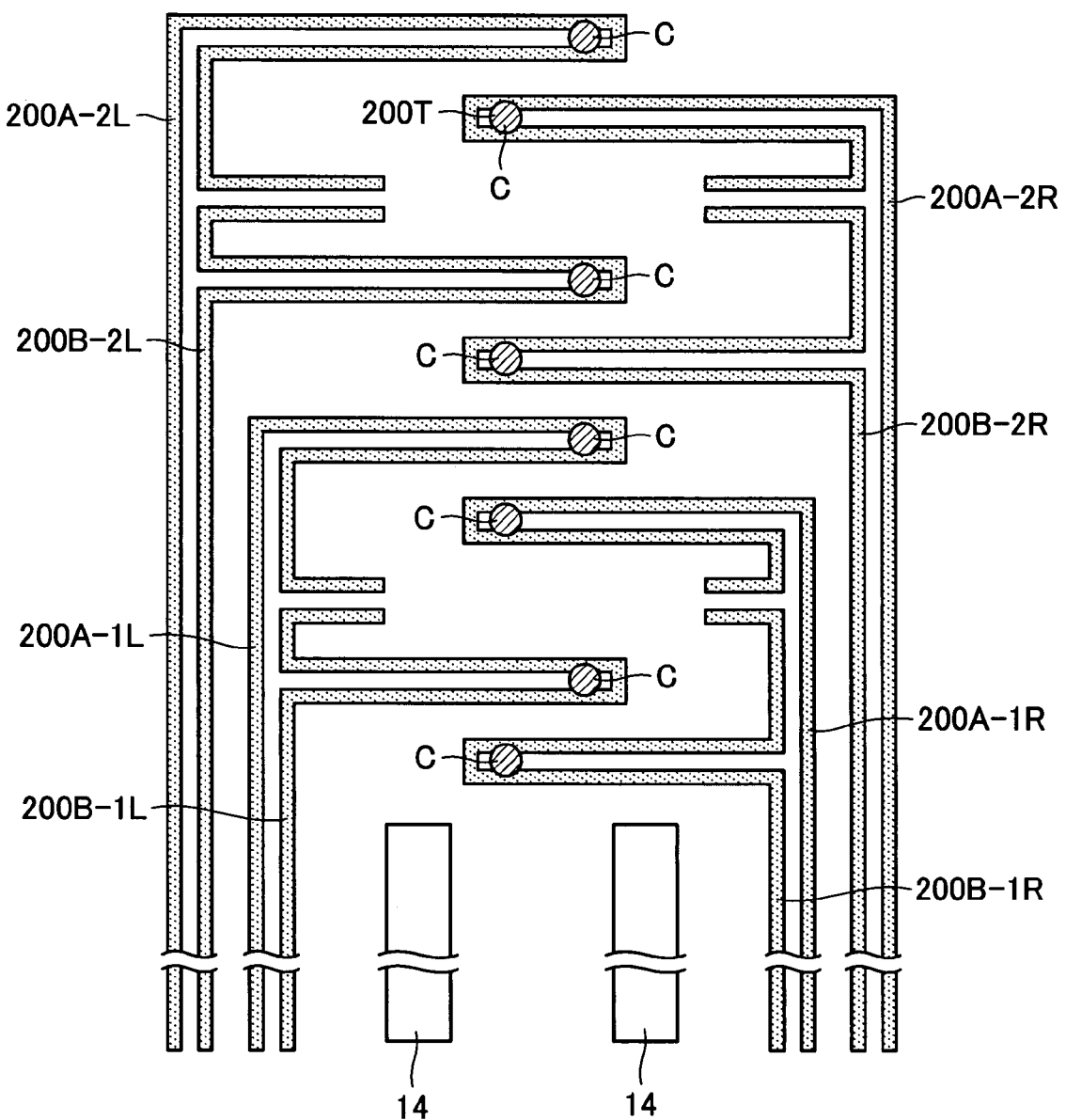
FIG. 9A shows another layout example.
Figure 9B:
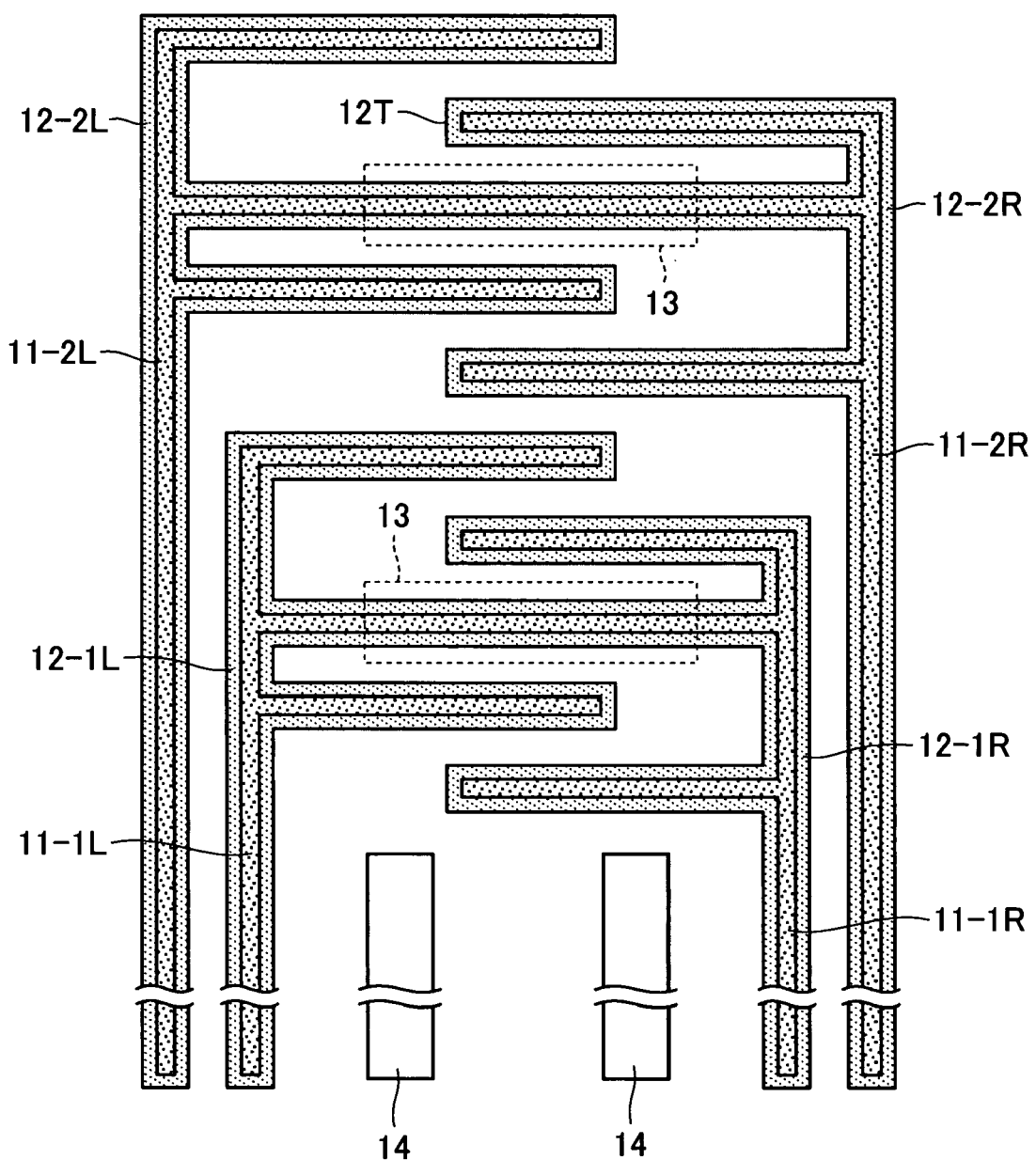
FIG. 9B shows process steps in the layout example of FIG. 9A.

The layout example of the hard masks 11 and the wiring layer 12 are not limited to the above example but rather various layouts may be provided. For example, FIG. 9A shows another layout example. In this example, the wiring layers 200A-iL, 200B-iL, 200A-iR, 200B-iR are not laterally symmetrical. Instead, the end portions (200T) of the wiring layers 200A-iL, 200B-iL are so nested that they enter spaces between the end portions 200T of the opposite wiring layers 200A-iR, 200B-iR. This point is same as in the example of FIG. 6. Only the central end portion of three end portions 200T is aligned with the opposite one on the same straight line. As shown in FIG. 9B, the end portions 200T aligned on the same straight line as opposed can be formed by forming on the same straight line the central short sides 11S of two sets of hard masks 11-iL, 11-iR having three short sides 11S, and making a closed-loop cut using a resist having an identical rectangular aperture.

Figure 10:
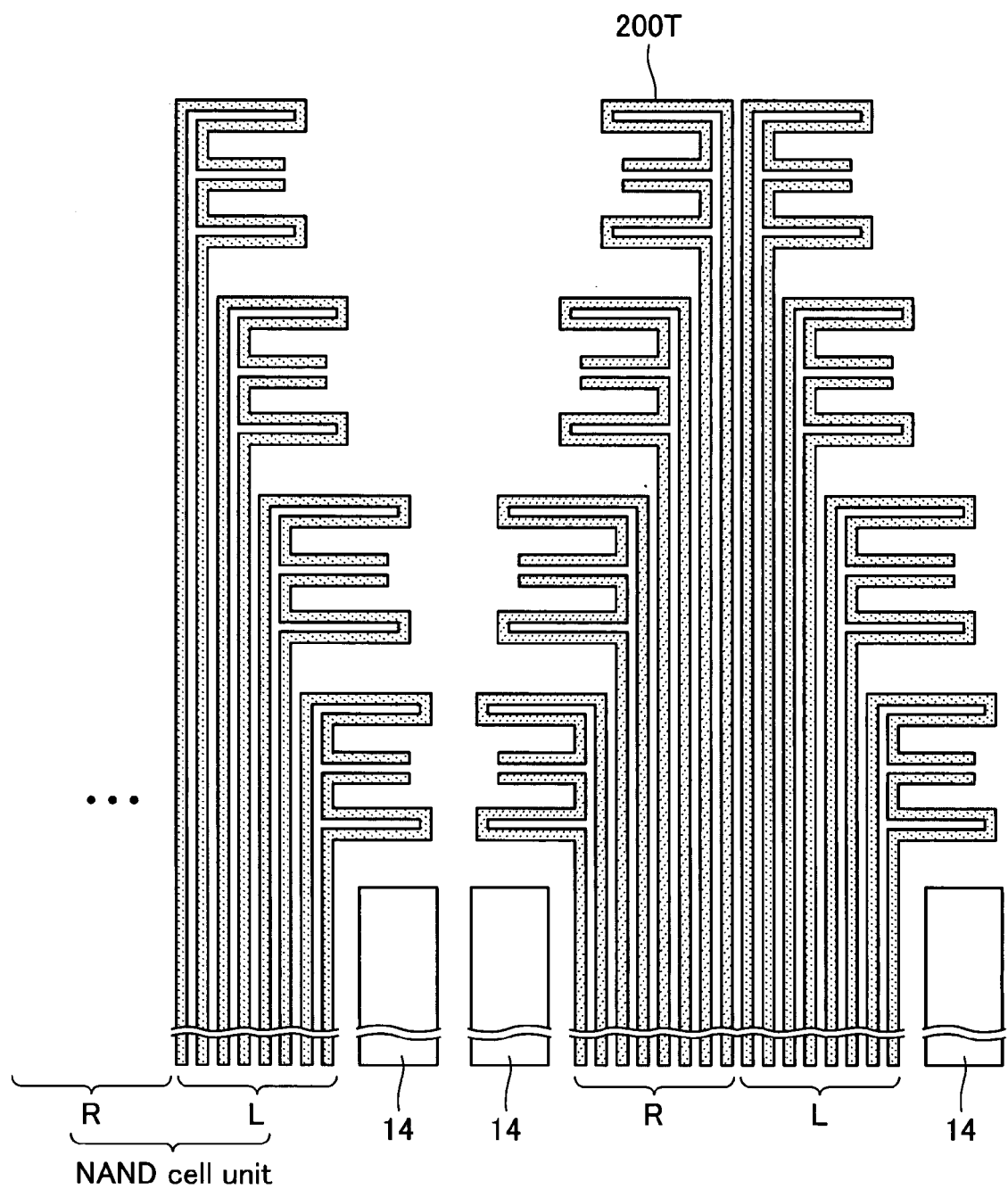
FIG. 10 shows another layout example.

In the layout example of FIGS. 4A and 6A, the positions of the short sides 11S, that is, the positions of the tips of the end portions 200T are aligned. In another layout, the positions of the end portions 200T may not be aligned in line as shown in FIG. 10.

Figure 11:
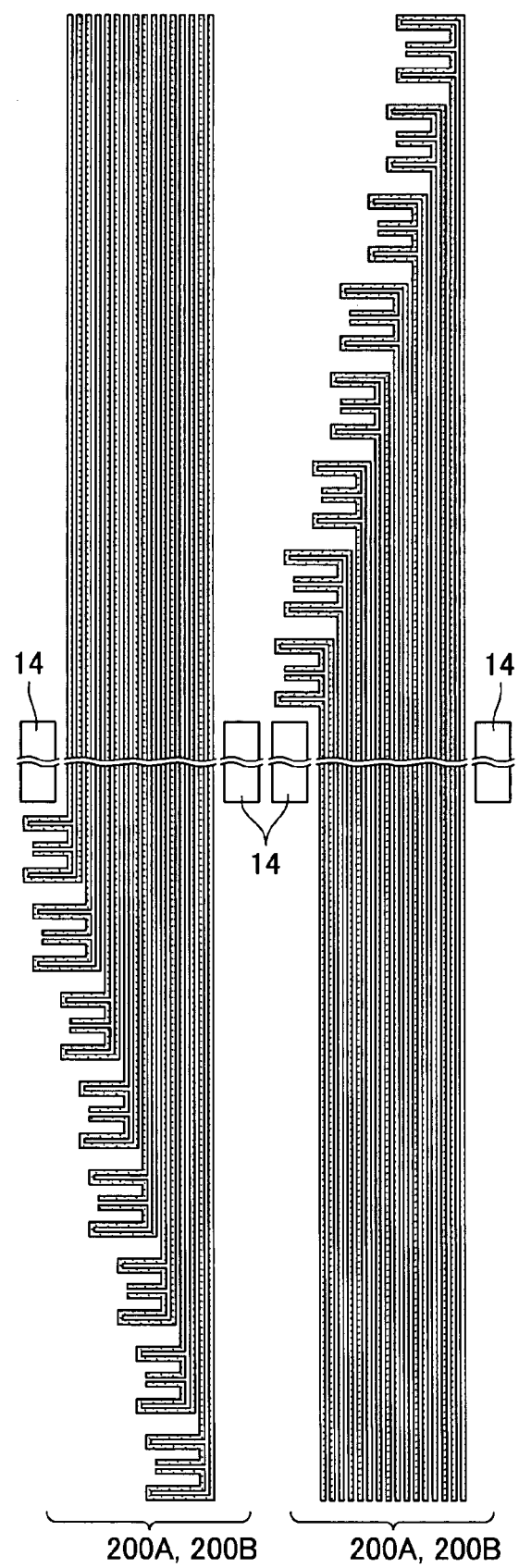
FIG. 11 shows another layout example.

Further, as shown in FIG. 11, the position, on which the short side 11S, that is, the end portion 200T is formed, may be one end of the long side 11L (a positive Y-coordinate) in a certain NAND cell unit, and the other end of the long side 11L (a negative Y-coordinate) in another NAND cell unit.

What is claimed is:

1. A semiconductor device comprising:
    a wiring layer comprising:
        a wiring portion having a cut; and
        a first loop wiring section comprising:
            two side portions having a first width;
            a closed end portion connecting the two side portions and having a second width larger than the first width; and
            an open end portion;
            wherein the closed end portion has the same height as the two side portions; and
    a first contact formed on the closed end portion and having a third width smaller than the second width.

2. The semiconductor device according to claim 1, wherein the wiring layer further comprises a second loop wiring section, the second loop wiring section comprising:
    two side portions;
    a closed end portion connecting the two side portions; and
    an open end portion; and
    the semiconductor device further comprises a second contact formed on the closed end portion of the second loop wiring section.

3. The semiconductor device according to claim 2, wherein the wiring portion is positioned between the first and second loop wiring sections.

* * * * *